US012740106B2

(12) United States Patent
Cheng

(10) Patent No.: US 12,740,106 B2
(45) Date of Patent: Sep. 15, 2026

(54) SEMICONDUCTOR STRUCTURE AND MANUFACTURING METHOD THEREFOR

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 358 days.

(21) Appl. No.: 18/637,253

(22) Filed: Apr. 16, 2024

(65) Prior Publication Data

US 2025/0113556 A1 Apr. 3, 2025

(30) Foreign Application Priority Data

Sep. 28, 2023 (CN) ........................ 202311277891.0

(51) Int. Cl.
*H01L 29/15* (2006.01)
*H01L 31/0312* (2006.01)
(Continued)

(52) U.S. Cl.
CPC ......... *H10D 62/104* (2025.01); *H10D 12/031* (2025.01); *H10D 30/66* (2025.01);
(Continued)

(58) Field of Classification Search
CPC .. H10D 62/104; H10D 30/66; H10D 62/8325; H10D 62/109; H10D 12/031; H10D 30/024; H10D 30/62; H10D 64/512; H10D 62/292; H10D 64/017; H10D 64/513; H10D 30/015; H10D 30/4732; H10D 30/475; H10D 30/4755; H10D 30/6891; H10D 62/343; H10D 62/393; H10D 62/824; H10D 62/8503; H10D 64/01358; H10D 64/511; H10D 64/691; H10D 64/693; H10D 30/023; H10D 30/025; H10D 30/026; H10D 30/0295; H10D 30/0297; H10D 30/031; H10D 30/611; H10D 30/63; H10D 30/665; H10D 30/668; H10D 30/6728; H10D 30/6735; H10D 30/6744; H10D 30/6757; H10D 62/058; H10D 62/111;
(Continued)

(56) References Cited

FOREIGN PATENT DOCUMENTS

CA 2855325 A1 * 6/2014

* cited by examiner

*Primary Examiner* — Niki H Nguyen
(74) *Attorney, Agent, or Firm* — Westbridge IP LLC

(57) ABSTRACT

Disclosed are a semiconductor structure and a manufacturing method therefor. The semiconductor structure includes an N-type substrate provided with a plurality of first grooves on a first surface; and an epitaxial layer located on the first surface, where the epitaxial layer includes an N-type drift region, a P-type well region, an N-type source region and a JFET region, where a surface of a side, away from the N-type substrate, of the epitaxial layer is provided with a plurality of second grooves, the second grooves are in one-to-one correspondence with the first grooves, and extension directions of the second grooves and the first grooves are parallel to a length direction of a channel of the semiconductor structure. A channel width may be effectively increased, thereby increasing a channel conduction area and reducing channel resistance and interface state density; and the epitaxial layer may be prevented from being damaged by etching.

20 Claims, 8 Drawing Sheets

(51) Int. Cl.
*H10D 12/01* (2025.01)
*H10D 30/66* (2025.01)
*H10D 62/10* (2025.01)
*H10D 62/832* (2025.01)
*H10P 30/22* (2026.01)

(52) U.S. Cl.
CPC ....... *H10D 62/109* (2025.01); *H10D 62/8325* (2025.01); *H10P 30/22* (2026.01)

(58) Field of Classification Search
CPC .. H10D 62/116; H10D 62/151; H10D 62/157; H10D 62/17; H10D 62/235; H10D 62/405; H10D 64/01; H10D 64/2527; H10D 64/517; H10D 64/518; H10D 64/519; H10D 84/0135; H10D 84/0167; H10D 84/017; H10D 84/0181; H10D 84/0186; H10D 84/0193; H10D 84/83; H10D 84/853; H10D 89/10; H10P 30/22
See application file for complete search history.

33
34
201
22
21
101
10
32

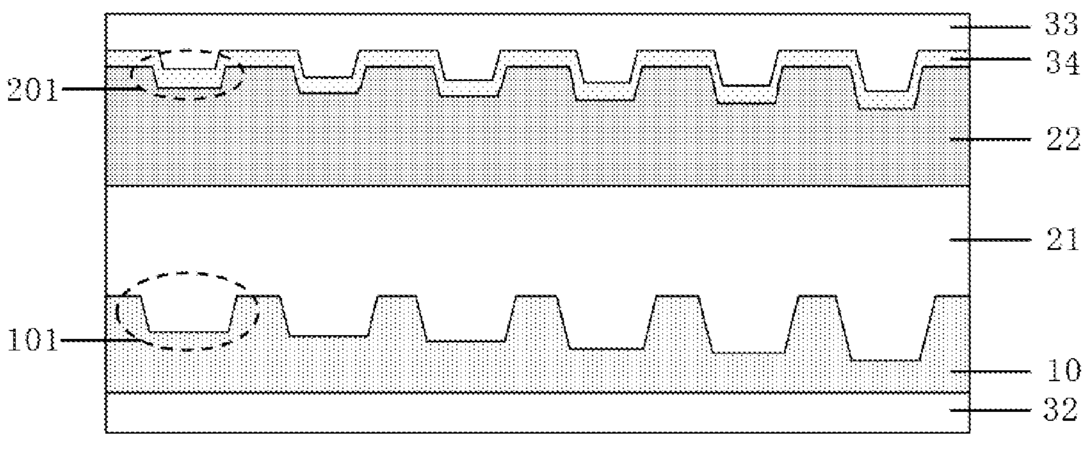
FIG. 4b
33
34
201
22
21
101
10
32
FIG. 4c
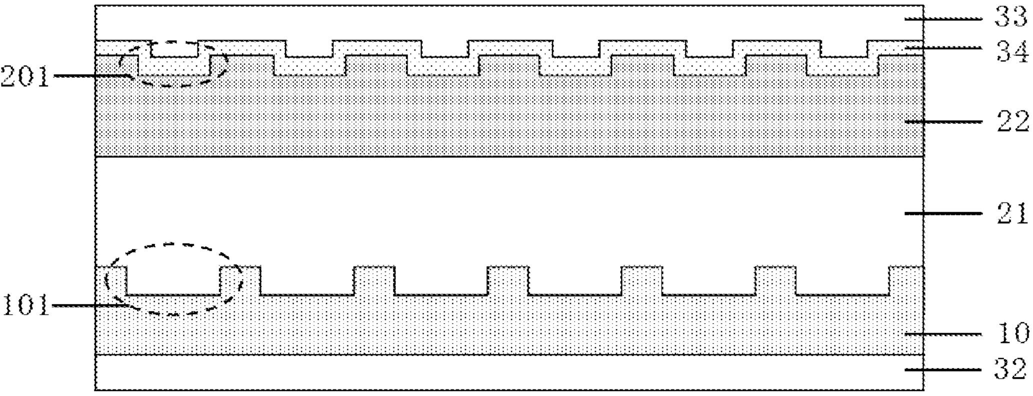
FIG. 5a

FIG. 7

SEMICONDUCTOR STRUCTURE AND MANUFACTURING METHOD THEREFOR

CROSS-REFERENCE TO RELATED APPLICATIONS

This application claims priority to Chinese Patent Application No. 202311277891.0, filed on Sep. 28, 2023, which is hereby incorporated by reference in its entirety.

TECHNICAL FIELD

The present disclosure relates to the field of semiconductor technologies, and in particular, to a semiconductor structure and a manufacturing method therefor.

BACKGROUND

A Silicon Carbide (SiC) Metal Oxide Semiconductor Field Effect Transistor (MOSFET) device has advantages of fast switching speed, low on-resistance, and the like, and can realize a higher breakdown voltage level with a relatively small thickness of a drift layer, thereby reducing a size of a power switch module and energy consumption, and having an obvious advantage in application fields of power switches, converters, and the like.

A SiC planar MOSFET device is widely used due to advantages of simple manufacture craft, good unit consistency, high avalanche energy ratio, and the like. However, how to further improve performance of the SiC planar MOSFET device, such as reducing on-resistance of the device, and improving linearity of the device, is one of hot issues those skilled in the art have been studying.

SUMMARY

In view of this, embodiments of the present disclosure provide a semiconductor structure and a manufacturing method therefor to further reduce on-resistance of a SiC planar MOSFET device.

According to an aspect of the present disclosure, an embodiment of the present disclosure provides a semiconductor structure, including:

- an N-type substrate, where the N-type substrate includes a first surface and a second surface opposite to the first surface, and the first surface is provided with a plurality of first grooves; and
- an epitaxial layer located on the first surface of the N-type substrate, where the epitaxial layer includes an N-type drift region, a P-type well region, an N-type source region, and a Junction Field-Effect Transistor (JFET) region, the N-type drift region is located on a side, close to the N-type substrate, of the epitaxial layer, the P-type well region and the JFET region are located on a side, away from the N-type substrate, of the epitaxial layer and are laterally adjacent, the P-type well region is provided on both sides of the JFET region, and the N-type source region is located on a side, away from the N-type substrate, of the P-type well region and located in the P-type well region, where a surface, away from the N-type substrate, of the epitaxial layer is provided with a plurality of second grooves, the second grooves are in one-to-one correspondence with the first grooves, and extension directions of the second grooves and the first grooves are parallel to a length direction of a channel of the semiconductor structure.

As an optional embodiment, along a width direction of the channel, a thickness of the P-type well region below the second groove is less than a thickness of the P-type well region between two adjacent second grooves.

As an optional embodiment, a doping concentration of P-type ions in a surface, away from the N-type substrate, of the P-type well region below the second groove is greater than a doping concentration of P-type ions in a surface, away from the N-type substrate, of the P-type well region between two adjacent second grooves.

As an optional embodiment, a thickness of the JFET region below the second groove is less than a thickness of the JFET region between two adjacent second grooves.

As an optional embodiment, a thickness of the N-type source region is constant along a width direction of the channel.

As an optional embodiment, along a width direction of the channel, a change trend of depths of the plurality of second grooves includes at least one of the following: periodic change, gradually increasing, gradually decreasing, first increasing and then decreasing, and first decreasing and then increasing.

As an optional embodiment, along the width direction of the channel, a change trend of thicknesses of the P-type well region below the plurality of second grooves is opposite to the change trend of depths of the plurality of second grooves.

As an optional embodiment, a depth of the second groove is less than a thickness of the N-type source region.

As an optional embodiment, a bottom surface of the second groove is a (0001) crystal face, and a sidewall of the second groove includes at least one of a (1100) crystal face, a (1010) crystal face, a (1120) crystal face, and a (0338) crystal face.

As an optional embodiment, a cross-sectional shape of the first groove and the second groove includes at least one of a rectangle, a trapezoid, a triangle, a bowl shape, and an arc in a direction perpendicular to the length direction of the channel.

As an optional embodiment, a second protrusion is provided between two adjacent second grooves, and a width of the second protrusion is less than or equal to 1 μm.

As an optional embodiment, a first protrusion is provided between two adjacent first grooves, and a cross-sectional shape of the first protrusion and the second protrusion includes at least one of a rectangle, a trapezoid, a triangle, a bowl shape and an arc shape in a direction perpendicular to the length direction of the channel.

As an optional embodiment, the semiconductor structure further includes:

- a source electrode, located on a side, away from the N-type substrate, of the N-type source region;
- a drain electrode, located on a side, away from the N-type source region, of the N-type substrate;
- a gate electrode, located on a side, away from the N-type substrate, of the P-type well region and the JFET region; and
- a gate oxide layer, located on a side, close to the N-type substrate, of the gate electrode.

As an optional embodiment, a material of the gate oxide layer includes at least one of aluminum oxide, aluminum nitride, and aluminum oxynitride.

As an optional embodiment, a material of the N-type substrate and the epitaxial layer includes silicon carbide.

According to another aspect of the present disclosure, an embodiment of the present disclosure provides a manufacturing method for a semiconductor structure, the method includes:

providing an N-type substrate, where the N-type substrate includes a first surface and a second surface opposite to the first surface, and the first surface is provided with a plurality of first grooves;

forming an epitaxial layer on the first surface of the N-type substrate, where a surface of a side, away from the N-type substrate, of the epitaxial layer is provided with a plurality of second grooves, the second grooves are in one-to-one correspondence with the first grooves, and extension directions of the second grooves and the first grooves are parallel to a length direction of a channel of the semiconductor structure; and performing ion implantation on a side, away from the N-type substrate, of the epitaxial layer to form a P-type well region, and performing ion implantation on a side, away from the N-type substrate, of the P-type well region to form an N-type source region, where the epitaxial layer further includes an N-type drift region and a JFET region without ion implantation, the N-type drift region is located on a side, close to the N-type substrate, of the epitaxial layer, the JFET region is located on a side, away from the N-type substrate, of the epitaxial layer, and the P-type well region is located on both sides of the JFET region.

As an optional embodiment, the second groove of the epitaxial layer is conformally formed on the first groove of the N-type substrate.

As an optional embodiment, the performing ion implantation on a side, away from the N-type substrate, of the epitaxial layer to form a P-type well region includes:

providing a silicon dioxide mask layer on the side, away from the N-type substrate, of the epitaxial layer, where a side, away from the N-type substrate, of the silicon dioxide mask layer is a flat;

performing the ion implantation to form the P-type well region with a side, close to the N-type substrate, of the P-type well region being flat; and removing the silicon dioxide mask layer.

As an optional embodiment, a thickness of the N-type source region formed by the ion implantation is constant.

As an optional embodiment, the manufacturing method for the semiconductor structure according to the embodiment of the present disclosure further includes:

conformally preparing a gate oxide layer on a side, away from the N-type substrate, of the P-type well region and the JFET region; and preparing a source electrode on a side, away from the N-type substrate, of the N-type source region, preparing a drain electrode on a side, away from the N-type source region, of the N-type substrate, and preparing a gate electrode on a side, away from the N-type substrate, of the gate oxide layer.

BRIEF DESCRIPTION OF THE DRAWINGS

FIG. 3 is a schematic structural diagram of the semiconductor structure shown in FIG. 1 along BB'.

FIG. 4*a* to FIG. 4*c* are schematic structural diagrams of a semiconductor structure according to an embodiment of the present disclosure.

FIG. 5*a* and FIG. 5*b* are schematic structural diagrams of a semiconductor structure according to an embodiment of the present disclosure.

FIG. 7 is a flowchart of a manufacturing method for a semiconductor structure according to an embodiment of the present disclosure.

DETAILED DESCRIPTION OF THE EMBODIMENTS

The technical solutions in the embodiments of the present disclosure will be clearly and completely described below with reference to the accompanying drawings in the embodiments of the present disclosure. Apparently, the described embodiments are only a part of the embodiments of the present disclosure, but not all of the embodiments. Based on the embodiments in the present disclosure, all other embodiments obtained by those skilled in the art without creative efforts shall fall within the protection scope of the present disclosure.

To further improve performance of a SiC planar MOSFET device, the present disclosure provides a semiconductor structure and a manufacturing method therefor. The semiconductor structure includes an N-type substrate provided with a plurality of first grooves on a first surface; and an epitaxial layer located on the first surface of the N-type substrate, where the epitaxial layer includes an N-type drift region, a P-type well region, an N-type source region and a JFET region, a surface of a side, away from the N-type substrate, of the epitaxial layer is provided with a plurality of second grooves, the second grooves are in one-to-one correspondence with the first grooves, and extension directions of the second grooves and the first grooves are parallel to a length direction of a channel of the semiconductor structure. In the present disclosure, the second groove of the epitaxial layer is obtained by a conformal preparation based on the first groove of the N-type substrate. On one hand, a channel width may be effectively increased, so that a channel conduction area is increased, thereby effectively reducing channel resistance and interface state density; and on the other hand, the epitaxial layer may be prevented from being damaged by etching, so that introduction of an interface impurity may be avoided.

In the following examples will be provided to further describe the semiconductor structure and the manufacturing method therefor mentioned in the present disclosure with reference to FIG. 1 to FIG. 15.

Figure 1:
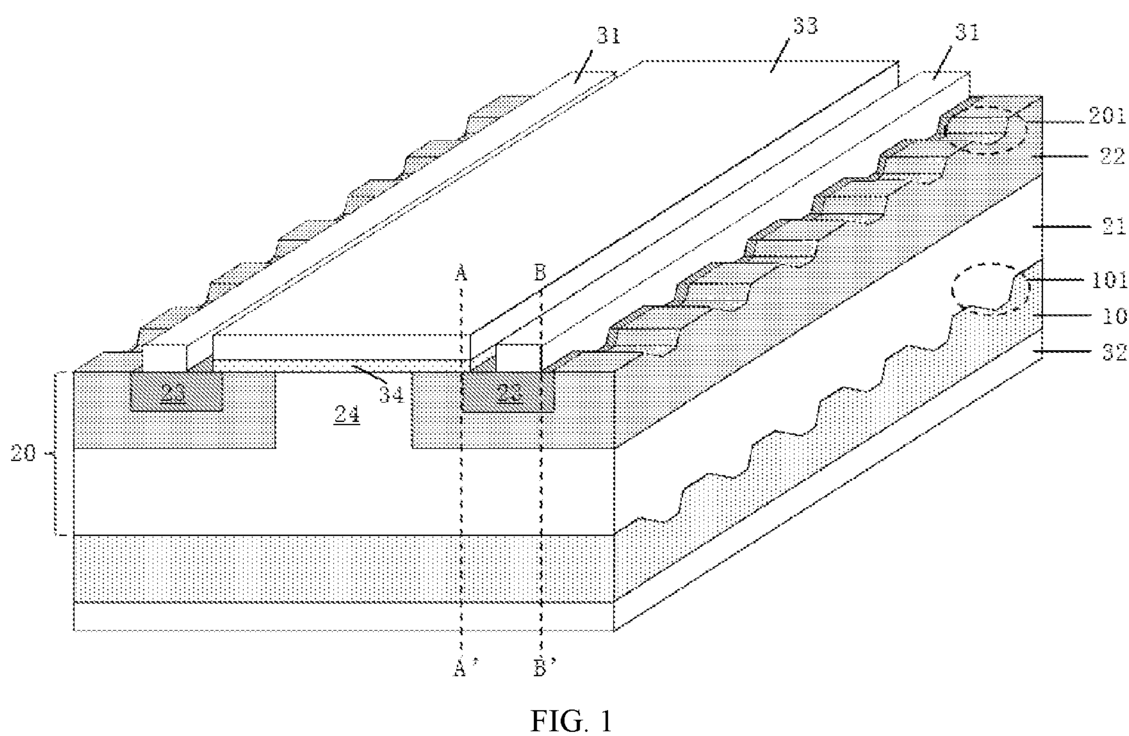
FIG. 1 is a schematic structural diagram of a semiconductor structure according to an embodiment of the present disclosure.

FIG. 1 is a schematic structural diagram of a semiconductor structure according to an embodiment of the present disclosure. As shown in FIG. 1, the semiconductor structure includes: an N-type substrate 10, where the N-type substrate 10 includes a first surface and a second surface opposite to the first surface, and the first surface is provided with a plurality of first grooves 101; an epitaxial layer 20, where the epitaxial layer 20 is located on the first surface of the N-type substrate 10, the epitaxial layer 20 includes an N-type drift region 21, a P-type well region 22, an N-type source region 23, and a JFET region 24, the N-type drift region 21 is located on a side, close to the N-type substrate 10, of the epitaxial layer 20, the P-type well region 22 and the JFET region 24 are located on a side, away from the N-type substrate 10, of the epitaxial layer 20 and are laterally adjacent, the P-type well region 22 is located on both sides of the JFET region 24, and the N-type source region 23 is located on a side, away from the N-type substrate 10, of the P-type well region 22 and located in the P-type well region 22. A surface of the side, away from the N-type substrate 10, of the epitaxial layer 20 is provided with a plurality of second grooves 201, the second grooves 201 are in one-to-one correspondence with the first grooves 101, and extension directions of the second grooves 201 and the first grooves 101 are parallel to a length direction of a channel of the semiconductor structure. As shown in FIG. 1, the semiconductor structure further includes: a source electrode 31, located on a side, away from the N-type substrate 10, of the N-type source region 23; a drain electrode 32, located on a side, away from the N-type source region 23, of the N-type substrate 10; a gate electrode 33, located on a side, away from the N-type substrate 10, of the P-type well region 22 and the JFET region 24; and a gate oxide layer 34, located on a side, close to the N-type substrate 10, of the gate electrode 33.

In this embodiment, a material of the N-type substrate 10 and the epitaxial layer 20 includes silicon carbide. In other alternative embodiments, the material of the N-type substrate 10 may alternatively be a substrate material such as silicon, sapphire, and the material of the epitaxial layer 20 may alternatively be a GaN-based material such as GaN, AlGaN. A material of the gate oxide layer 34 includes at least one of aluminum oxide, aluminum nitride, and aluminum oxynitride. The material of the gate oxide layer 34 has a strong capability of binding charge, therefore in a formed external electric field, a charge may not be easily polarized. As a quantity of polarization charges is small, a polarization electric field is weak, so that a short channel effect of the semiconductor structure may be effectively avoided. The gate oxide layer 34 is provided to form a MIS (Metal Insulator Semiconductor) gate electrode structure, so that a gate electrode leakage current may be effectively reduced, gate electrode voltage swing and drain electrode current swing may be increased, thereby improving performance of the device.

Figure 2:
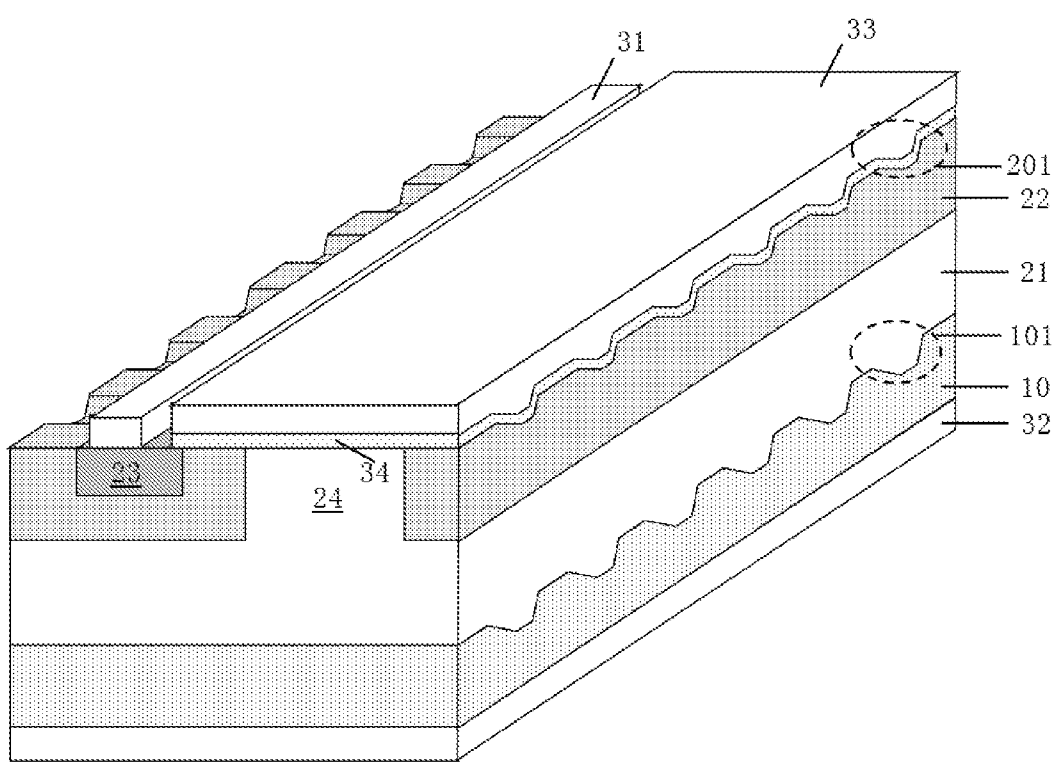
FIG. 2 is a schematic structural diagram of the semiconductor structure shown in FIG. 1 along AA'.

In this embodiment, FIG. 2 is a schematic structural diagram of the semiconductor structure shown in FIG. 1 along AA'. As shown in FIG. 2, a thickness of the P-type well region 22 below the second groove 201 is less than a thickness of the P-type well region 22 between two adjacent second grooves 201. As the P-type well region 22 is formed by an ion implantation process, a concentration of P-type ions in the P-type well region 22 is distributed as Gaussian distribution. The greater the thickness of the P-type well region 22 is, the less the concentration of the P-type ions in a surface, away from the N-type substrate 10, of the P-type well region 22 is. Therefore, a P-type ion doping concentration of a surface, away from the N-type substrate 10, of the P-type well region 22 below the second groove 201 is greater than a P-type ion doping concentration of a surface, away from the N-type substrate 10, of the P-type well region 22 between two adjacent second grooves 201. By setting the second grooves 201, thicknesses of the P-type well region 22 along a width direction of the channel are different, and ion doping concentrations of a surface of the P-type well region 22 with different thicknesses are different, so that different threshold voltages are formed at different positions of a channel layer. Accordingly, the semiconductor structure is gradually turned on along the width direction of the channel, and a falling of a transconductance curve may be slowed down when a drain electrode current is respectively great, so that transconductance flatness of the semiconductor structure is improved, and linearity of the semiconductor structure is further improved.

In this embodiment, the JFET region 24 is formed between two adjacent P-type well regions 22, and a thickness of the JFET region 24 is the same as a thickness of the P-type well region 22. Therefore, the thickness of the JFET region 24 below the second groove 201 is less than the thickness of the JFET region 24 between two adjacent second grooves 201. The smaller the thickness of the JFET region 24 is, the less the resistance of the JFET region 24 is. The thickness of the JFET region 24 may be controlled by controlling the thickness of the P-type well region 22, thereby adjusting the resistance of the JFET region 24, and ultimately adjusting the on-resistance.

Figures 3, 4A:
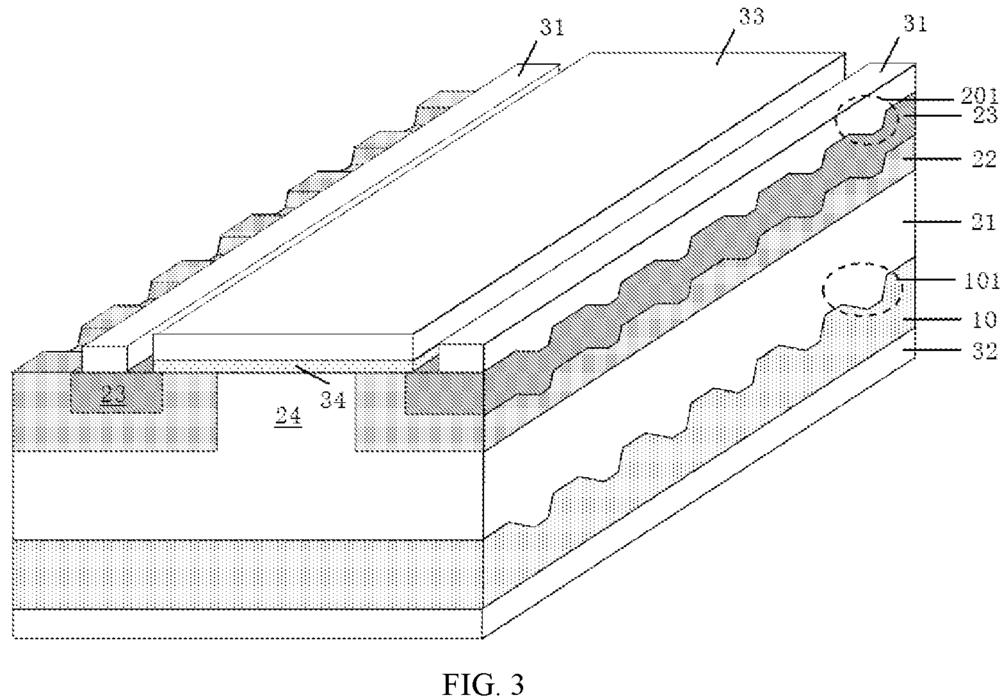

In this embodiment, FIG. 3 is a schematic structural diagram of the semiconductor structure shown in FIG. 1 along BB'. As shown in FIG. 3, along the width direction of the channel, a thickness of the N-type source region 23 is constant, so that a current of the source electrode 31 may be uniformly distributed in the N-type source region 23, thereby improving uniformity of a source electrode current.

In an embodiment, a depth of the second groove 201 is less than the thickness of the N-type source region 23. A bottom surface of the second groove 201 is a (0001) crystal face, a side wall of the second groove 201 includes at least one of a (1100) crystal face, a (1010) crystal face, a (1120) crystal face, and a (0338) crystal face, and channel mobility of the side wall of the second groove 201 is greater than that of the bottom face of the second groove 201. By setting the second grooves 201, on one hand, a channel width may be effectively increased, that is, a width of the side wall of the second groove 201 is increased, so that a channel conduction area is increased, and channel resistance and interface state density are effectively reduced; on the other hand, electron mobility of a side wall crystal face of the second groove 201 is greater than electron mobility of a horizontal plane, so that electron mobility of the semiconductor structure is effectively improved, thereby reducing channel resistance of the semiconductor structure.

In an embodiment, FIG. 4*a* to FIG. 4*c* are schematic structural diagrams of a semiconductor structure according to an embodiment of the present disclosure. As shown in FIG. 4*a*, a depth of at least one second groove 201 is different from that of the other second grooves 201, and a thickness of the P-type well region 22 below the at least one second groove 201 is different from that of the P-type well region 22 below the other second grooves 201. The greater the depth of the second groove 201 is, the less the thickness of the P-type well region 22 is, and the greater the P-type ion concentration of a surface, away from a N-type substrate 10, of the P-type well region 22 is. The thickness of the P-type well region 22 is negatively correlated with the depth of the second groove 201, and the thickness of the P-type well region 22 may be controlled by controlling the depth of the second groove 201, thereby controlling the ion doping concentration on the surface of the P-type well region 22, and ultimately controlling a threshold voltage of a channel layer.

Optionally, along the width direction of the channel, a depth change trend of the plurality of second grooves 201 includes at least one of following change trends: periodic change (as shown in FIG. 4*a*), gradually increasing (as shown in FIG. 4*b*), gradually decreasing, first increasing and then decreasing (as shown in FIG. 4*c*), or first decreasing and then increasing. Along the width direction of the channel, a thickness change trend of the P-type well region 22 below the plurality of second grooves 201 is opposite to the depth change trend of the plurality of second grooves 201, and a P-type ion concentration change trend of a surface, away from the N-type substrate 10, of the P-type well region 22 below the plurality of second grooves 201 is the same as the depth change trend of the plurality of second grooves 201. As ion concentrations in P-type well regions 22 are different along the width direction of the channel, different threshold voltages are formed at different positions of a channel layer, so that the semiconductor structure is gradually turned on along the width direction of the channel, and a falling of a transconductance curve may be slowed down when a drain electrode current is respectively great, thereby improving transconductance flatness of the semiconductor structure and linearity of the semiconductor structure.

Figure 5B:
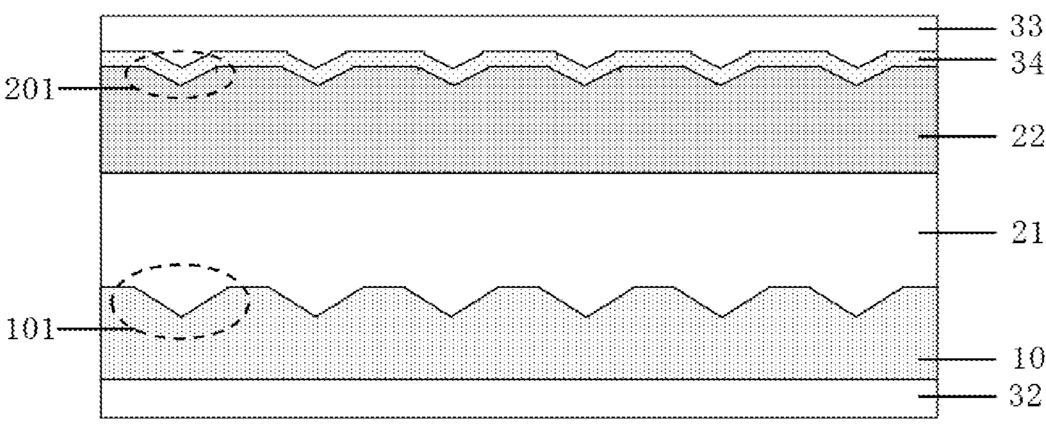

In an embodiment, FIG. 5*a* and FIG. 5*b* are schematic structural diagrams of a semiconductor structure according to an embodiment of the present disclosure. In a direction perpendicular to the length direction of the channel, cross-sectional shapes of the first groove 101 and the second groove 202 include at least one of a rectangle (as shown in FIG. 5*a*), a trapezoid, a triangle (as shown in FIG. 5*b*), a bowl shape, and an arc. The cross-sectional shapes of the first groove 101 and the second groove 201 are not specifically limited. By controlling the shape of the second groove 201, a shape and surface ion concentration of the P-type well region 22 may be controlled, so as to control threshold voltages of a channel layer at different positions.

Figure 6A:
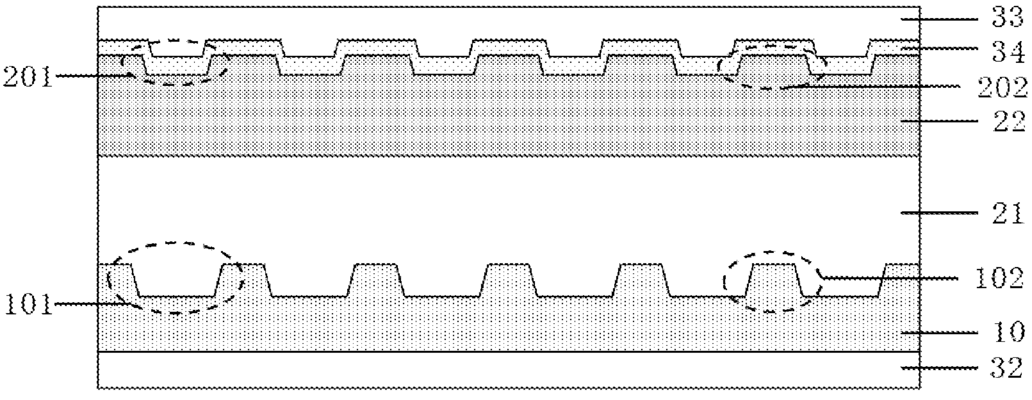
FIG. 6*a* and FIG. 6*b* are schematic structural diagrams of a semiconductor structure according to an embodiment of the present disclosure.
Figure 6B:
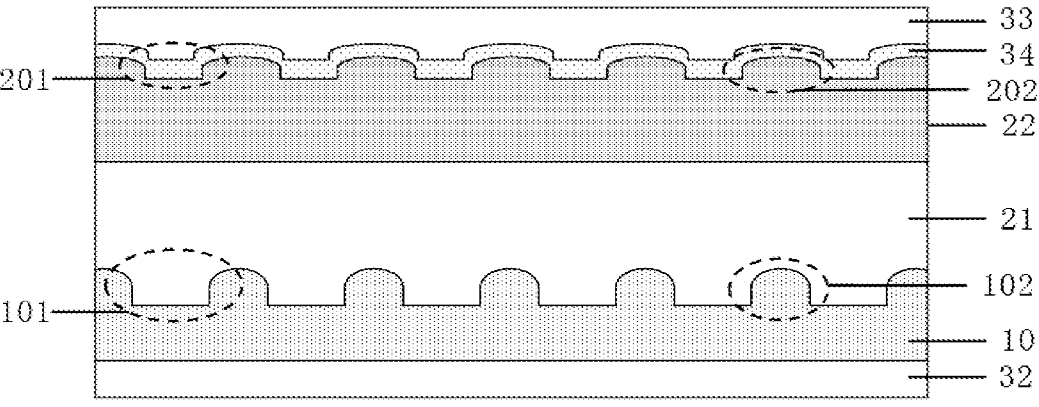

In an embodiment, FIG. 6*a* and FIG. 6*b* are schematic structural diagrams of a semiconductor structure according to an embodiment of the present disclosure. A second protrusion 202 is provided between two adjacent second grooves 201, and a width of the second protrusion 202 is less than or equal to 1 μm. A first protrusion 102 is provided between two adjacent first grooves 101, and a cross-sectional shape of the first protrusion 102 and the second protrusion 202 includes at least one of a rectangle, a trapezoid (as shown in FIG. 6*a*), a triangle, a bowl, and an arc (as shown in FIG. 6*b*). By controlling the shape of the second protrusion 202, the shape and the surface ion concentration of the P-type well region 22 may be controlled accordingly, thereby controlling the threshold voltages of the channel layer at different positions.

Figure 7:
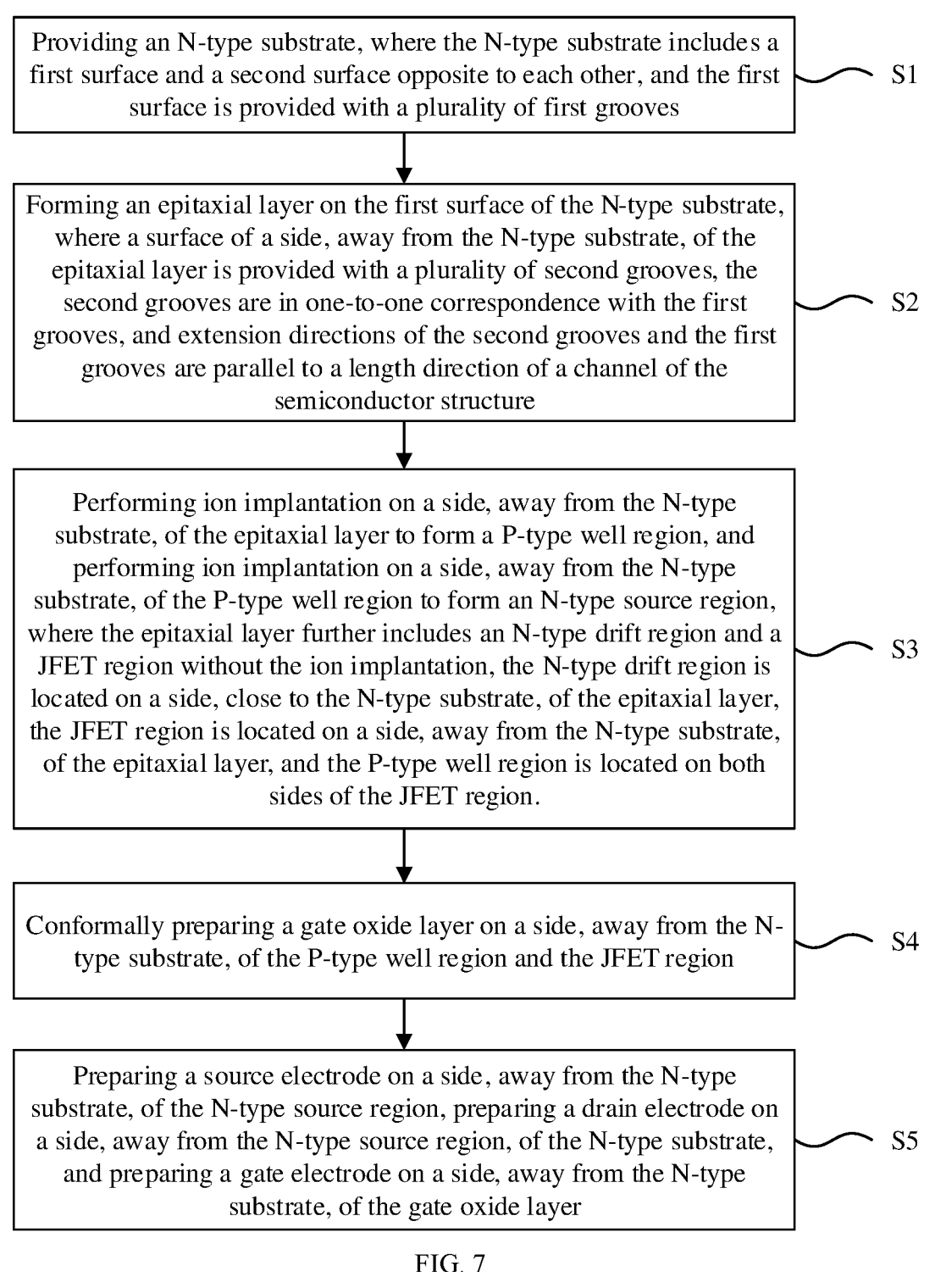

An embodiment of the present disclosure further provides a manufacturing method for a semiconductor structure. FIG. 7 is a flowchart of a manufacturing method for a semiconductor structure according to an embodiment of the present disclosure. FIG. 8 to FIG. 15 are schematic structural diagrams of intermediate structures of a semiconductor structure according to an embodiment of the present disclosure. As shown in FIG. 7, the manufacturing method for the semiconductor structure includes the following steps.

Figure 8:
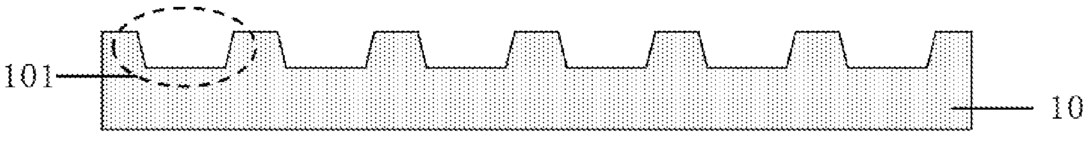
FIG. 8 to FIG. 15 are schematic structural diagrams of intermediate structures of a semiconductor structure according to an embodiment of the present disclosure.

Step S1: providing an N-type substrate, where the N-type substrate includes a first surface and a second surface opposite to the first surface, and the first surface is provided with a plurality of first grooves. As shown in FIG. 8, a material of the N-type substrates 10 includes silicon carbide. In other alternative embodiments, a material of the N-type substrate 10 may alternatively be a substrate material such as silicon or sapphire and the like.

Figure 9:
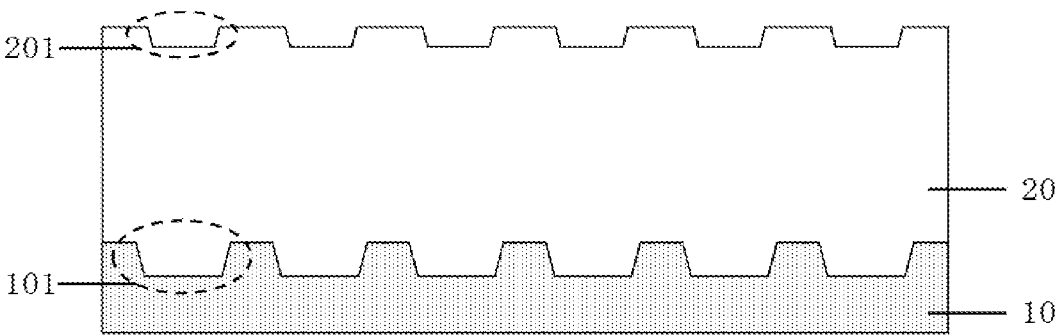

Step S2: forming an epitaxial layer on the first surface of the N-type substrate, where a surface of a side, away from the N-type substrate, of the epitaxial layer is provided with a plurality of second grooves, the second grooves are in one-to-one correspondence with the first grooves, and extension directions of the second grooves and the first grooves are parallel to a length direction of a channel of the semiconductor structure. As shown in FIG. 9, the second groove 201 of the epitaxial layer 20 is conformally formed on the first groove 101 of the N-type substrate 10, and compared with a method of forming a second groove 201 by etching, etching damage to the epitaxial layer 20 is avoided, so that introduction of an interface impurity is avoided.

Figure 10:
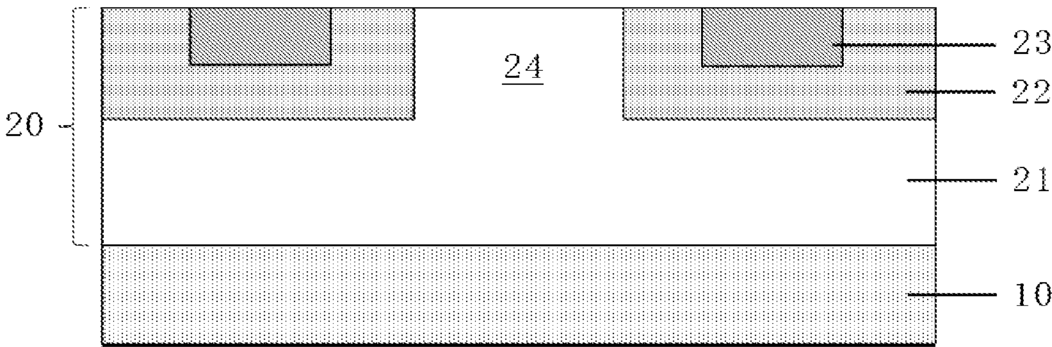
Figure 11:
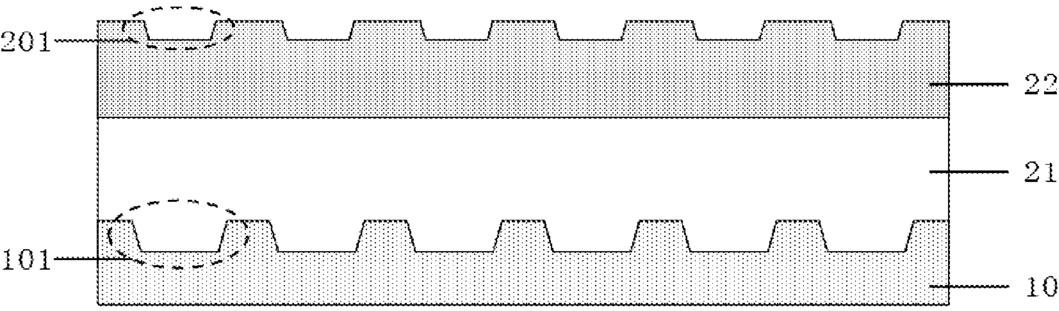
Figure 12:
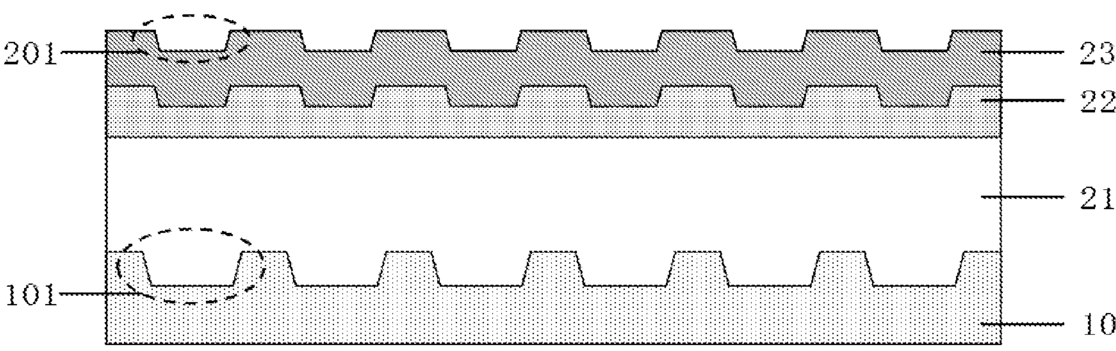

Step S3: performing ion implantation on a side, away from the N-type substrate, of the epitaxial layer to form a P-type well region, and performing ion implantation on a side, away from the N-type substrate, of the P-type well region to form an N-type source region, where the epitaxial layer further includes an N-type drift region and a JFET region without the ion implantation, the N-type drift region is located on a side, close to the N-type substrate, of the epitaxial layer, the JFET region is located on a side, away from the N-type substrate, of the epitaxial layer, and the P-type well region is located on both sides of the JFET region. As shown in FIG. 10 to FIG. 12, a thickness of the N-type source region 23 formed by means of the ion implantation is constant, so that a current of a source electrode 31 may be uniformly distributed in the N-type source region 23, thereby improving uniformity of a source electrode current.

Figure 13:
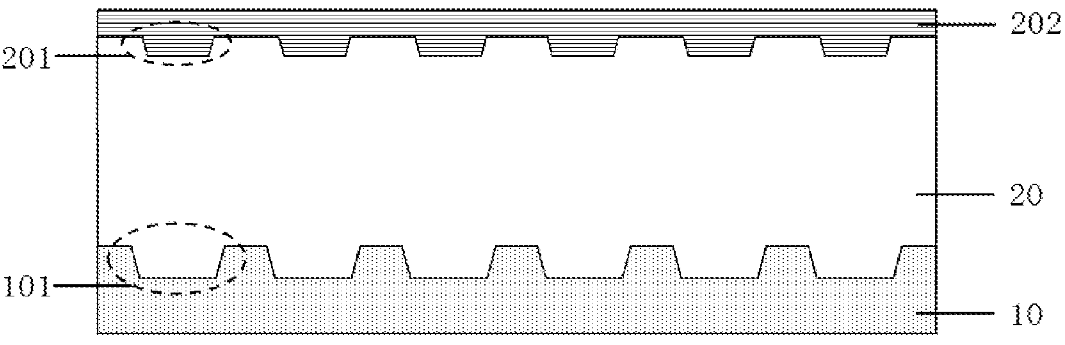
Figure 14:
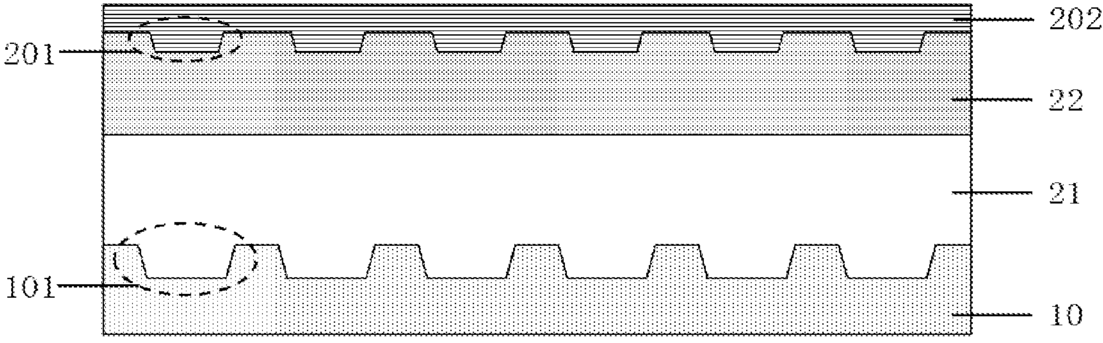

In this embodiment, a method of performing ion implantation on a side, away from the N-type substrate, of the epitaxial layer to form a P-type well region includes: providing a silicon dioxide mask layer on the side, away from the N-type substrate, of the epitaxial layer, where a side, away from the N-type substrate, of the silicon dioxide mask layer is a plane (as shown in FIG. 13); performing the ion implantation to form the P-type well region (as shown in FIG. 14), where a side, close to the N-type substrate, of the P-type well region is a plane; and removing the silicon dioxide mask layer (as shown in FIG. 11). A shape of a side, close to the N-type substrate 10, of the P-type well region 22 may be controlled by controlling a surface shape of a side, away from the N-type substrate 10, of the silicon dioxide mask layer 202, and the side, close to the N-type substrate 10, of the P-type well region 22 is a plane, therefore, a thickness of the P-type well region 22 is negatively correlated with a depth of the second groove 201. Due to a fact that ion-implanted P-type impurity ions are in Gaussian distribution, ion doping concentrations of a surface of the P-type well regions 22 of different thicknesses are different, so that different threshold voltages are formed at different positions of a channel layer. In this way, a semiconductor structure is gradually turned on in a width direction of the channel, so that a falling of a transconductance curve may be slowed down when a drain electrode current is respectively great, thereby improving transconductance flatness and linearity of the semiconductor structure.

After Step S3, the method further includes the following steps.

Figure 15:
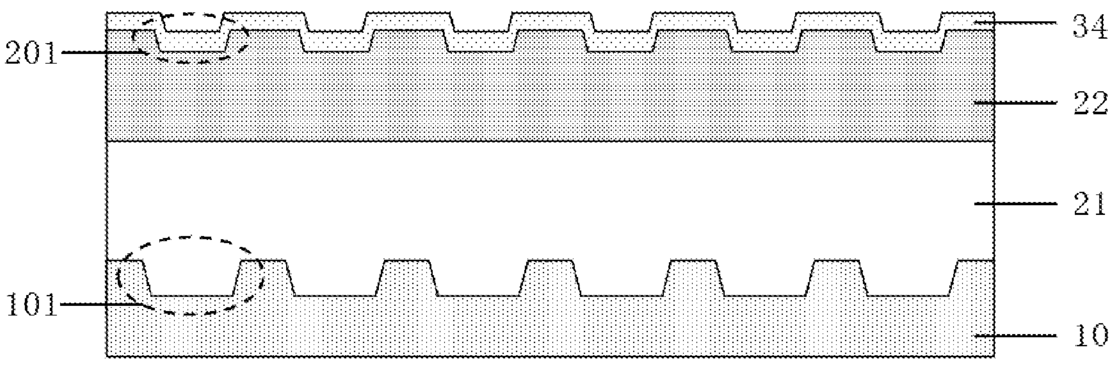

Step S4: conformally preparing a gate oxide layer on a side, away from the N-type substrate, of the P-type well region and the JFET region (as shown in FIG. 15).

Step S5: preparing a source electrode on a side, away from the N-type substrate, of the N-type source region, preparing a drain electrode on a side, away from the N-type source region, of the N-type substrate, and preparing a gate electrode on a side, away from the N-type substrate, of the gate oxide layer. A semiconductor structure as shown in FIG. 1 is formed. The gate electrode 33 fills a groove in the gate oxide layer 34 and covers a surface of the gate oxide layer 34, thereby effectively increasing a gate electrode control area and improving control capability of the gate electrode 33 to a channel.

The present disclosure provides a semiconductor structure and a manufacturing method therefor. The semiconductor structure includes an N-type substrate, where the N-type substrate includes a first surface and a second surface opposite to the first surface, and the first surface is provided with a plurality of first grooves; and an epitaxial layer, where the epitaxial layer is located on the first surface of the N-type substrate, the epitaxial layer includes an N-type drift region, a P-type well region, an N-type source region, and a JFET region, the N-type drift region is located on a side, close to the N-type substrate, of the epitaxial layer, the P-type well region and the JFET region are located on a side, away from the N-type substrate, of the epitaxial layer and are laterally adjacent, the P-type well region is located on both sides of the JFET region, and the N-type source region is located on a side, away from the N-type substrate, of the P-type well region and located in the P-type well region, where a surface of the side, away from the N-type substrate, of the epitaxial layer is provided with a plurality of second grooves, the second grooves are in one-to-one correspondence with the first grooves, and extension directions of the second grooves and the first grooves are parallel to a length direction of a channel of the semiconductor structure.

The second groove is provided in the present disclosure. On one hand, a channel width may be effectively increased, that is, a width of the side wall of the second groove is increased, thereby effectively reducing channel resistance and interface state density; on the other hand, electron mobility of a side wall crystal face of the second groove is greater than that of a horizontal plane, so that electron mobility of the semiconductor structure is effectively improved; and on the other hand, a gate electrode fills the second grooves and covers a surface of a second protrusion, so that a gate electrode control area is effectively increased, thereby improving control capability of the gate electrode to a channel.

The N-type drift region is formed on the first surface of the N-type substrate. As the first surface is provided with the plurality of first grooves, the side, away from the N-type substrate, of the epitaxial layer is provided with the plurality of second grooves. Compared with a method of forming a second groove by etching, etching damage to the epitaxial layer is avoided, and introduction of interface impurity is avoided.

The second groove provided in the present disclosure enables the P-type well region to have different thicknesses along the width direction of the channel. Because ion-implanted P-type impurity ions are in Gaussian distribution, ion doping concentrations on a surface of the P-type well region with different thicknesses are different, so that different threshold voltages are formed at different positions of the channel layer. In this way, the semiconductor structure is gradually turned on along the width direction of the channel, and a falling of a transconductance curve may be slowed down when a drain electrode current is respectively great, thereby improving transconductance flatness and linearity of the semiconductor structure.

It should be understood that the terms "including" and variations therefor used in the present disclosure are open-ended, that is, "including but not limited to". The term "one embodiment" means "at least one embodiment"; the term "another embodiment" means "at least one other embodiment". In the specification, the schematic representation of the above terms does not necessarily refer to the same embodiment or example. Furthermore, the particular features, structures, materials, or characteristics described may be combined in an appropriate manner in any one or more embodiments or examples. In addition, in the case of no contradiction, a person skilled in the art may be in combination with and combine different embodiments or examples described in the specification and features of different embodiments or examples.

The foregoing descriptions are merely preferred embodiments of the present disclosure, and are not intended to limit the present disclosure, and any modification, equivalent replacement, and the like, made within the spirit and principle of the present disclosure should be included within the protection scope of the present disclosure.

What is claimed is:

1. A semiconductor structure, comprising:

an N-type substrate, wherein the N-type substrate comprises a first surface and a second surface opposite to the first surface, and the first surface is provided with a plurality of first grooves; and an epitaxial layer located on the first surface of the N-type substrate, wherein the epitaxial layer comprises an N-type drift region, a P-type well region, an N-type source region, and a Junction Field-Effect Transistor (JFET) region, the N-type drift region is located on a side, close to the N-type substrate, of the epitaxial layer, the P-type well region and the JFET region are located on a side, away from the N-type substrate, of the epitaxial layer and are laterally adjacent, the P-type well region is provided on both sides of the JFET region, and the N-type source region is located on a side, away from the N-type substrate, of the P-type well region and located in the P-type well region, wherein a surface, away from the N-type substrate, of the epitaxial layer is provided with a plurality of second grooves, the plurality of second grooves are in one-to-one correspondence with the plurality of first grooves, and extension directions of the plurality of second grooves and the plurality of first grooves are parallel to a length direction of a channel of the semiconductor structure.

2. The semiconductor structure according to claim 1, wherein a thickness of the P-type well region below the second groove is less than a thickness of the P-type well region between two adjacent second grooves.

3. The semiconductor structure according to claim 2, wherein a doping concentration of P-type ions in a surface, away from the N-type substrate, of the P-type well region below the second groove is greater than a doping concentration of P-type ions in a surface, away from the N-type substrate, of the P-type well region between two adjacent second grooves.

4. The semiconductor structure according to claim 2, wherein a thickness of the JFET region below the second groove is less than a thickness of the JFET region between two adjacent second grooves.

5. The semiconductor structure according to claim 1, wherein a thickness of the N-type source region is constant along a width direction of the channel.

6. The semiconductor structure according to claim 1, wherein along a width direction of the channel, a change trend of depths of the plurality of second grooves comprises at least one of the following: periodic change, gradually increasing, gradually decreasing, first increasing and then decreasing, and first decreasing and then increasing.

7. The semiconductor structure according to claim 6, wherein along the width direction of the channel, a change trend of thicknesses of the P-type well region below the plurality of second grooves is opposite to the change trend of depths of the plurality of second grooves.

8. The semiconductor structure according to claim 1, wherein a depth of the second groove is less than a thickness of the N-type source region.

9. The semiconductor structure according to claim 1, wherein a bottom surface of the second groove is a (0001) crystal face, and a sidewall of the second groove comprises at least one of a (1100) crystal face, a (1010) crystal face, a (1120) crystal face, and a (0338) crystal face.

10. The semiconductor structure according to claim 1, wherein a cross-sectional shape of the first groove and the second groove comprises at least one of a rectangle, a trapezoid, a triangle, a bowl shape, and an arc in a direction perpendicular to the length direction of the channel.

11. The semiconductor structure according to claim 1, wherein a second protrusion is provided between two adjacent second grooves, and a width of the second protrusion is less than or equal to 1 μm.

12. The semiconductor structure according to claim 11, wherein a first protrusion is provided between two adjacent first grooves, and a cross-sectional shape of the first protrusion and the second protrusion comprises at least one of a rectangle, a trapezoid, a triangle, a bowl shape and an arc shape in a direction perpendicular to the length direction of the channel.

13. The semiconductor structure according to claim 1, further comprising:

a source electrode, located on a side, away from the N-type substrate, of the N-type source region;

a drain electrode, located on a side, away from the N-type source region, of the N-type substrate;

a gate electrode, located on a side, away from the N-type substrate, of the P-type well region and the JFET region; and a gate oxide layer, located on a side, close to the N-type substrate, of the gate electrode.

14. The semiconductor structure according to claim 13, wherein a material of the gate oxide layer comprises at least one of aluminum oxide, aluminum nitride, and aluminum oxynitride.

15. The semiconductor structure according to claim 1, wherein a material of the N-type substrate and the epitaxial layer comprises silicon carbide.

16. A manufacturing method for a semiconductor structure, comprising:

providing an N-type substrate, wherein the N-type substrate comprises a first surface and a second surface opposite to the first surface, and the first surface is provided with a plurality of first grooves;

forming an epitaxial layer on the first surface of the N-type substrate, wherein a surface of a side, away from the N-type substrate, of the epitaxial layer is provided with a plurality of second grooves, the plurality of second grooves are in one-to-one correspondence with the plurality of first grooves, and extension directions of the plurality of second grooves and the plurality of first grooves are parallel to a length direction of a channel of the semiconductor structure; and performing ion implantation on a side, away from the N-type substrate, of the epitaxial layer to form a P-type well region, and performing ion implantation on a side, away from the N-type substrate, of the P-type well region to form an N-type source region, wherein the epitaxial layer further comprises an N-type drift region and a JFET region without ion implantation, the N-type drift region is located on a side, close to the N-type substrate, of the epitaxial layer, the JFET region is located on a side, away from the N-type substrate, of the epitaxial layer, and the P-type well region is located on both sides of the JFET region.

17. The manufacturing method for the semiconductor structure according to claim 16, wherein the second groove of the epitaxial layer is conformally formed on the first groove of the N-type substrate.

18. The manufacturing method for the semiconductor structure according to claim 16, wherein the performing ion implantation on a side, away from the N-type substrate, of the epitaxial layer to form a P-type well region comprises:

providing a silicon dioxide mask layer on the side, away from the N-type substrate, of the epitaxial layer, wherein a side, away from the N-type substrate, of the silicon dioxide mask layer is a flat;

performing the ion implantation to form the P-type well region with a side, close to the N-type substrate, of the P-type well region being flat; and removing the silicon dioxide mask layer.

19. The manufacturing method for the semiconductor structure according to claim 16, wherein a thickness of the N-type source region formed by the ion implantation is constant.

20. The manufacturing method for the semiconductor structure according to claim 16, further comprising:

conformally preparing a gate oxide layer on a side, away from the N-type substrate, of the P-type well region and the JFET region; and preparing a source electrode on a side, away from the N-type substrate, of the N-type source region, preparing a drain electrode on a side, away from the N-type source region, of the N-type substrate, and preparing a gate electrode on a side, away from the N-type substrate, of the gate oxide layer.

* * * * *